(12) United States Patent
Endo et al.

(10) Patent No.: US 7,255,974 B2
(45) Date of Patent: Aug. 14, 2007

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 14 days.

(21) Appl. No.: 11/260,385

(22) Filed: Oct. 28, 2005

(65) Prior Publication Data

US 2006/0163198 A1 Jul. 27, 2006

(30) Foreign Application Priority Data

Jan. 26, 2005 (JP) .............................. 2005-017818

(51) Int. Cl.
G03C 1/494 (2006.01)
G03C 1/492 (2006.01)
G03C 1/76 (2006.01)
G03C 5/00 (2006.01)

(52) U.S. Cl. .................. 430/270.1; 430/311; 430/312; 430/313

(58) Field of Classification Search ........ 430/311–313, 430/270.1
See application file for complete search history.

(56) References Cited

U.S. PATENT DOCUMENTS 6,017,680 A * 1/2000 Hattori et al. .............. 430/313

2002/0142251 A1 10/2002 Endo et al.

FOREIGN PATENT DOCUMENTS

WO  WO 02/44845  6/2002

OTHER PUBLICATIONS

T. Kudo et al., "Illumination, Acid Diffusion and Process Optimization Considerations for 193 nm Contact Hole Resists", Proc. SPIE, vol. 4690, p. 150 (2002).
Y. Uetani et al., "Positive ArF Resist With 2EAdMA/GBLMA Resin System", vol. 3678, No. 1, Mar. 1999, pp. 510-517, XP002385141.
Search Report dated Jun. 13, 2006.

* cited by examiner

*Primary Examiner*—Geraldina Visconti
(74) *Attorney, Agent, or Firm*—McDermott Will & Emery LLP

(57) ABSTRACT

In a pattern formation method, a resist film including a compound having a lactone ring is formed on a substrate of silicon oxide. Then, pattern exposure is performed by selectively irradiating the resist film with exposing light, and the resist film is developed after the pattern exposure so as to form a resist pattern made of the resist film. Subsequently, the lactone ring included in the resist pattern is opened by exposing the resist pattern to an acrylic acid aqueous solution. Thereafter, with the resist pattern where the lactone ring has been opened used as a mask, the substrate is etched, so as to form a recess in a good shape.

9 Claims, 6 Drawing Sheets

PATTERN FORMATION METHOD

CROSS-REFERENCE TO RELATED APLICATIONS

This application claims priority under 35 U.S.C. §119 on U.S. patent application No. 2005-17818 filed in Japan on Jan. 26, 2005, the entire contents of which are hereby incorporated by reference.

BACKGROUND OF THE INVENTION

The present invention relates to a pattern formation method for use in fabrication process or the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, it is regarded significant to increase the life time of ArF excimer laser lithography, and resists for use in the ArF excimer laser lithography are now being developed.

Some of such ArF resists have a lactone ring in the composition of a polymer included therein (for example, see T. Kudo et al., "Illumination, Acid Diffusion and Process Optimization Considerations for 193 nm Contact Hole Resists", Proc. SPIE, vol. 4690, p. 150 (2002)). This is because a lactone ring is expected to improve the adhesion or the like of a resist pattern onto a target film (i.e., a film to be etched by using the resist pattern).

Now, a conventional pattern formation method will be described with reference to FIGS. 5A through 5D, 6A and 6B.

First, a positive chemically amplified resist material having the following composition is prepared:

| | |
|---|---|
| Base polymer: poly(2-methyl-2-adamantyl methacrylate (50 mol %) - γ-butyrolactone methacrylate (40 mol %) - 2-hydroxy adamantane methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 5A, the aforementioned chemically amplified resist material is applied on a substrate 1 of silicon oxide so as to form a resist film 2 with a thickness of 0.35 μm.

Then, as shown in FIG. 5B, pattern exposure is carried out by irradiating the resist film 2 with exposing light 4 of ArF excimer laser of a wavelength of 193 nm with NA of 0.68 through a mask 3.

After the pattern exposure, as shown in FIG. 5C, the resist film 2 is baked with a hot plate at a temperature of 105° C. for 60 seconds, and the resultant resist film is developed with a 0.26 N tetramethylammonium hydroxide developer. In this manner, a resist pattern 2a made of an unexposed portion of the resist film 2 and having an opening width of 0.09 μm is formed as shown in FIG. 5D.

Next, as shown in FIG. 6A, the substrate 1 is etched with fluorine radicals with the resist pattern 2a used as a mask. At this point, FIG. 6A is a cross-sectional view of the substrate 1 and FIG. 6B is a plan view of the substrate 1 on which the resist pattern 2a is formed. As shown in FIG. 6B, a recess 1a having an opening width of 0.09 μm is formed in the substrate 1 through this etching.

However, as shown in FIG. 6B, the recess 1a formed in the substrate 1 by the conventional pattern formation method is in a defective shape with an irregular wall.

SUMMARY OF THE INVENTION

The present inventors have variously examined the reason why the recess 1a formed in the substrate 1 is in a defective shape, resulting in finding the following: As shown in the cross-sectional view of FIG. 6A and the plan view of FIG. 6B, irregular roughness is caused on the surface of the resist pattern 2a in the etching, and the roughness is transferred to the shape of the recess 1a of the substrate 1. Furthermore, the present inventors have found that the surface roughness of the resist pattern 2a is caused because lactone rings, which are included in the resist pattern 2a for improving the adhesion onto the substrate 1, are decomposed in the etching.

When such an opening pattern formed in the substrate corresponding to a target film is in a defective shape, the productivity and the yield in the fabrication process for semiconductor devices are disadvantageously lowered.

In consideration of the aforementioned conventional problem, an object of the invention is preventing the pattern failure caused in a target film in performing etching by using a resist pattern including a compound having lactone rings.

The present inventors have found, on the basis of the results of the aforementioned examination, that surface roughness of a resist pattern caused in etching can be prevented by opening lactone rings included in the resist pattern after forming the resist pattern, namely, before performing the etching.

Lactone rings heterogeneously open through impact against radicals during the etching. This derives from the structure of a lactone ring. Specifically, a lactone ring has a cyclic structure of a five-membered ring or a six-membered ring including —C(=O)—O— as is well known, and is composed of an aggregate including bonding links with different strengths such as a bonding link between an oxygen atom and a carbon atom and a bonding link between carbon atoms. Specifically, the bonding link between an oxygen atom and a carbon atom has smaller bonding force than the bonding link between carbon atoms. Therefore, the etching resistance of the bonding link between an oxygen atom and a carbon atom is lower than the etching resistance of the bonding link between carbon atoms. Accordingly, the bonding link between an oxygen atom and a carbon atom is more easily opened than the bonding link between carbon atoms through the impact against radicals or the like during the etching. As a result, portions each corresponding to an opened bonding link between an oxygen atom and a carbon atom with low etching resistance are heterogeneously present in the resist pattern, and therefore, the surface of the resist pattern is roughened during the etching.

Accordingly, if lactone rings included in the resist pattern are opened before the etching, the number of bonding links between carbon atoms in the cyclic portion is reduced, and hence, a difference in the etching resistance in the lactone molecule can be reduced. In other words, a chain compound is produced by previously opening the lactone rings, and hence, the lactone ring can be thus made to have a structure minimally suffering from steric hindrance. As a result, the etching resistance is slightly lowered as a whole and variation in the etching resistance in the resist pattern can be simultaneously reduced, so that the surface roughness otherwise caused in the resist pattern can be prevented.

In order to open a lactone ring, a resist pattern formed through exposure and development is exposed to an acidic aqueous solution or an alkaline aqueous solution having larger alkali normality than a developer used in the development. Thus, an ester decomposition reaction is caused so as to open a lactone ring. In the case where a lactone ring is opened by using an alkaline aqueous solution, carboxylic acid generated through the opening of the lactone ring is reacted with the alkaline aqueous solution, so that the resist pattern may be disadvantageously dissolved. Therefore, the conditions employed in process for exposing the resist pattern to the alkaline aqueous solution should be carefully set.

The present invention was devised on the basis of the aforementioned finding, and in the pattern formation method according to the invention in which a compound having a lactone ring is included in a resist material, the lactone ring is opened before etching a resist pattern.

Specifically, the pattern formation method of this invention includes the steps of forming a resist film including a compound having a lactone ring on a substrate; performing pattern exposure by selectively irradiating the resist film with exposing light; forming a resist pattern made of the resist film by developing the resist film after the pattern exposure; opening the lactone ring included in the resist pattern; and etching the substrate by using, as a mask, the resist pattern in which the lactone ring has been opened.

In the pattern formation method of this invention, the lactone ring included in the formed resist pattern is opened before etching the substrate, and therefore, conventional variation that merely a bonding link between an oxygen atom and a carbon atom is opened and a bonding link between carbon atoms is not opened does not occur in the etching. Accordingly, when the resist pattern in which the lactone ring has been opened is used as a mask in etching the substrate, surface roughness of the resist pattern can be prevented, resulting in forming an etching pattern in the substrate in a good shape.

Although it is preferred that all lactone rings included in the resist pattern are opened, there is no need to always open 100% of lactone rings, and the effect of the invention can be attained when at least approximately 30% of the lactone rings included in the resist pattern are opened.

In the pattern formation method of the invention, the step of opening the lactone ring is preferably executed by exposing the resist pattern to an acidic aqueous solution. Thus, the lactone ring can be opened through the ester decomposition reaction.

In this case, the acidic aqueous solution can include a compound having a carboxylic acid group or a sulfonic acid group.

The compound having a carboxylic acid group can be acrylic acid, methacrylic acid or benzoic acid.

Also, the compound having a sulfonic acid group can be styrene sulfonic acid.

Alternatively, in the pattern formation method of the invention, the step of opening the lactone group is preferably executed by exposing the resist pattern to an alkaline aqueous solution having larger alkali normality than a developer used in developing the resist film. Thus, the lactone ring can be opened through the ester decomposition reaction.

In this case, the alkaline aqueous solution can be an aqueous solution including an amine compound.

The amine compound can be tetramethylammonium hydroxide, tetraethylammonium hydroxide or choline.

In the pattern formation method of the invention, the exposing light can be KrF excimer laser, $Xe_2$ laser, ArF excimer laser, $F_2$ laser, KrAr laser or $Ar_2$ laser.

DETAILED DESCRIPTION OF THE INVENTION

Embodiment 1

A pattern formation method according to Embodiment 1 of the invention will now be described with reference to FIGS. 1A through 1D and 2A through 2D.

First, a positive chemically amplified resist material having the following composition is prepared:

| | |
|---|---|
| Base polymer: poly(2-methyl-2-adamantyl methacrylate (50 mol %) - γ-butyrolactone methacrylate (40 mol %) - 2-hydroxy admanatane methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Figure 1A:
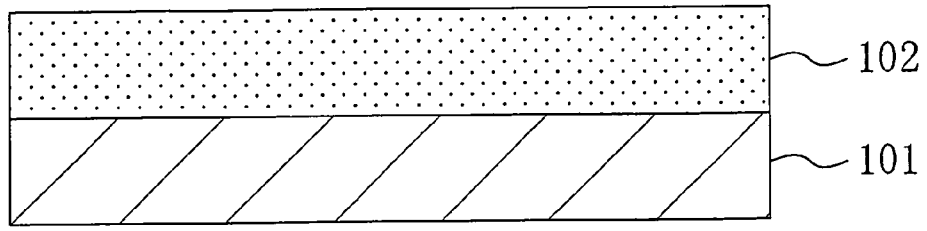
FIGS. 1A, 1B, 1C and 1D are cross-sectional views for showing procedures in a pattern formation method according to Embodiment 1 of the invention.

Next, as shown in FIG. 1A, the aforementioned chemically amplified resist material is applied on a substrate 101 of, for example, silicon oxide so as to form a resist film 102 with a thickness of 0.35 μm.

Figure 1B:
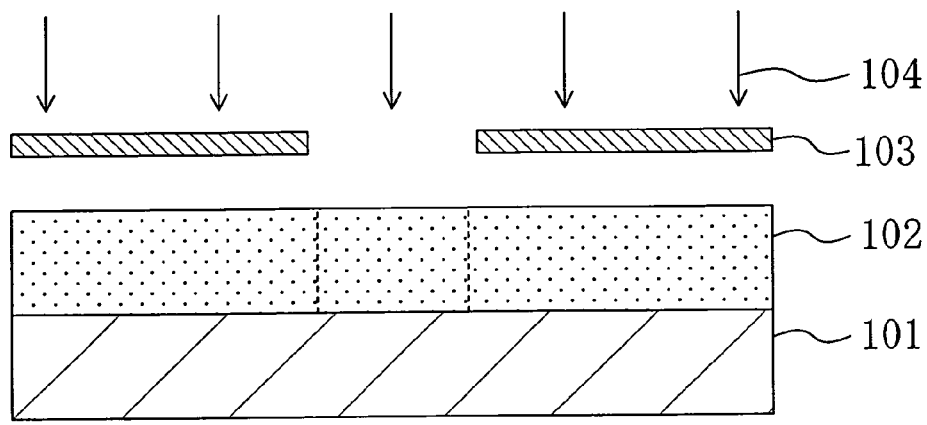

Then, as shown in FIG. 1B, pattern exposure is carried out by irradiating the resist film 102 through a mask 103 with exposing light 104 of ArF excimer laser of a wavelength of 193 nm with NA of 0.68.

Figure 1C:
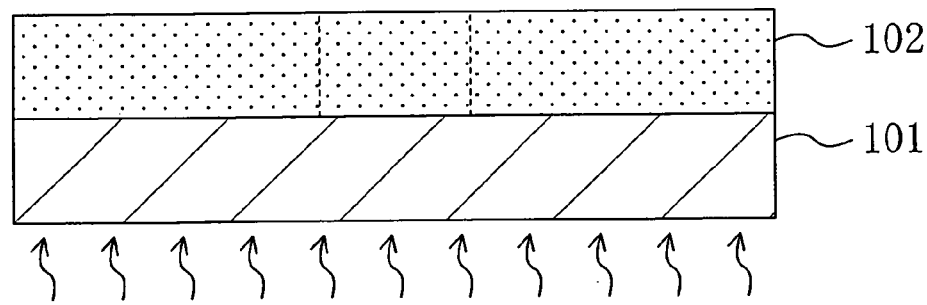
Figure 1D:
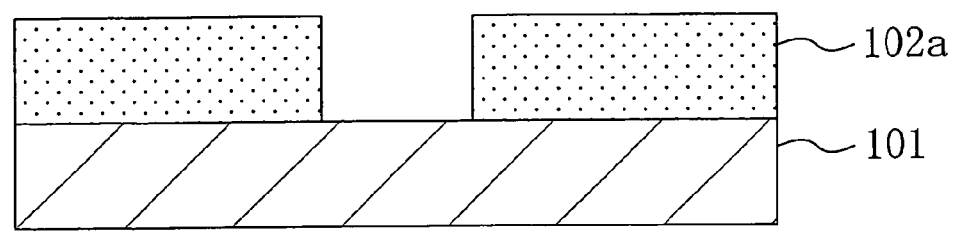

After the pattern exposure, as shown in FIG. 1C, the resist film 102 is baked with a hot plate at a temperature of 105° C. for 60 seconds. Thereafter, the resultant resist film 102 is developed with a 0.26 N tetramethylammonium hydroxide developer. In this manner, a resist pattern 102a made of an unexposed portion of the resist film 102 and having an opening width of 0.09 μm is formed as shown in FIG. 1D.

Figure 2A:
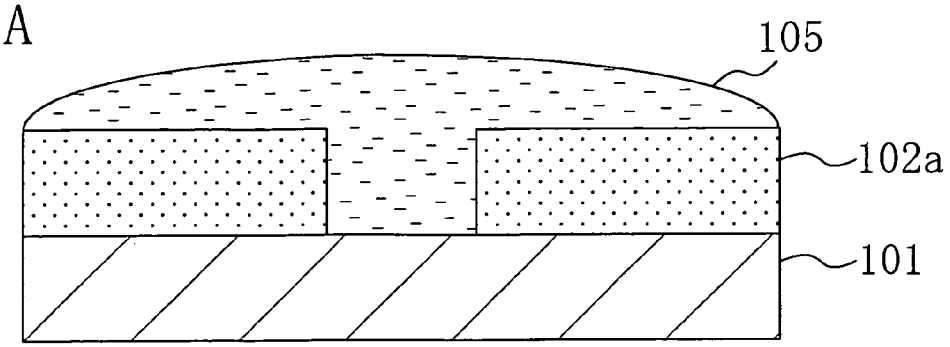
FIGS. 2A, 2B and 2C are cross-sectional views for showing other procedures in the pattern formation method of Embodiment 1
Figure 2B:
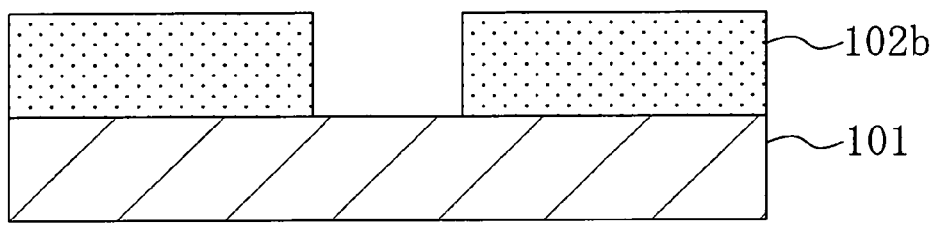

Next, as shown in FIG. 2A, an acidic aqueous solution 105 including 10 wt % of acrylic acid is dropped onto the resist pattern 102a by what is called a puddle method, thereby exposing the resist pattern 102a to the acidic aqueous solution 105 for 60 seconds. Through this puddle process, lactone rings included in the resist pattern 102a are opened so as to give a resist pattern 102b as shown in FIG. 2B.

Figure 2C:
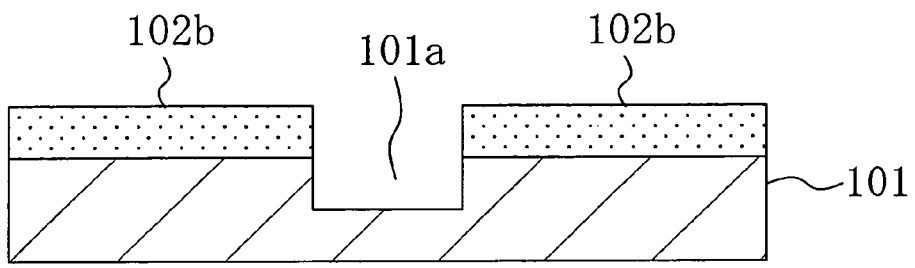

Then, as shown in FIG. 2C, with the resist pattern 102b, in which the lactone rings are opened, used as a mask, the substrate 101 is etched by using an etching gas including fluorine radicals. In this manner, a recess 101a having an opening width of 0.09 μm is formed in the substrate 101 as shown in a plan view of FIG. 2D. At this point, FIG. 2C is a cross-sectional view taken on line IIc-IIc of FIG. 2D.

Figure 2D:
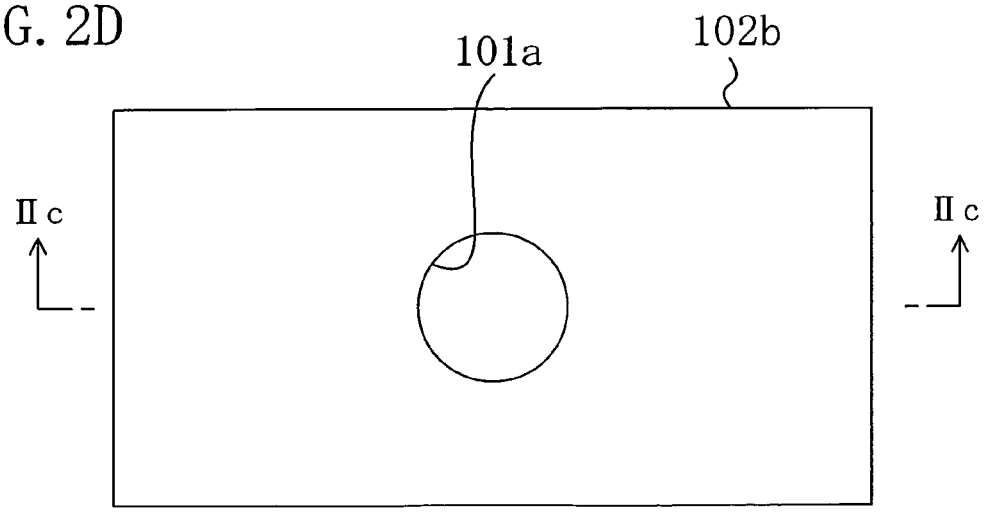
FIG. 2D is a plan view of FIG. 2C.

In this manner, according to Embodiment 1, since the resist pattern 102a formed through the development is exposed to the acidic aqueous solution 105 in the step shown in FIG. 2A, the lactone rings included in the resist material are opened before performing the etching. Accordingly, the resist pattern 102b where the lactone rings have been opened is free from surface roughness otherwise caused by the radicals or the like included in the etching gas during the subsequently performed etching (as shown in FIGS. 2C and 2D). This is for the following reason: Since the lactone rings have been already opened, the radicals used in the etching are never consumed in the ring opening reaction, and therefore, a stable amount of radicals can be supplied to the surface of the substrate 101 to be etched. As a result, the recess 101a formed in the substrate 101 by the etching can be in a good shape.

Embodiment 2

A pattern formation method according to Embodiment 2 of the invention will now be described with reference to FIGS. 3A through 3D and 4A through 4D.

First, a positive chemically amplified resist material having the following composition is prepared:

| | |
|---|---|
| Base polymer: poly(2-methyl-2-adamantyl methacrylate (50 mol %) - γ-butyrolactone methacrylate (40 mol %) - 2-hydroxy admanatane methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Figure 3A:
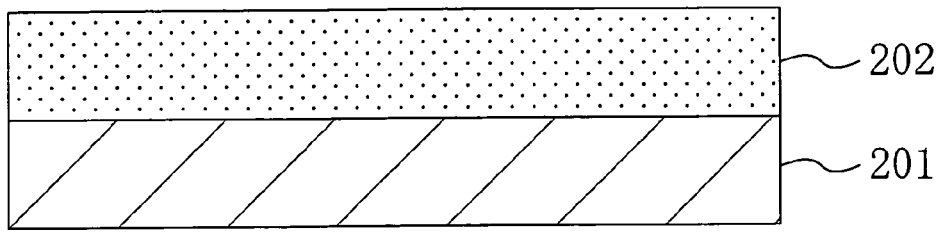
FIGS. 3A, 3B, 3C and 3D are cross-sectional views for showing procedures in a pattern formation method according to Embodiment 2 of the invention.

Next, as shown in FIG. 3A, the aforementioned chemically amplified resist material is applied on a substrate 201 of, for example, silicon oxide so as to form a resist film 202 with a thickness of 0.35 μm.

Figure 3B:
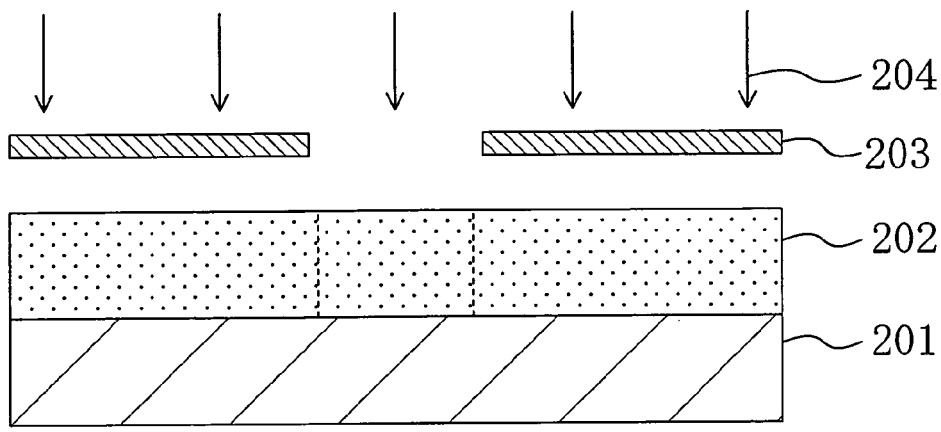

Then, as shown in FIG. 3B, pattern exposure is carried out by irradiating the resist film 202 through a mask 203 with exposing light 204 of ArF excimer laser of a wavelength of 193 nm with NA of 0.68.

Figure 3C:
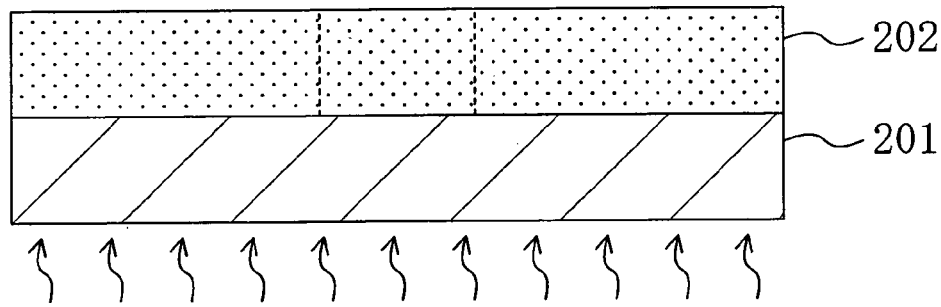
Figure 3D:
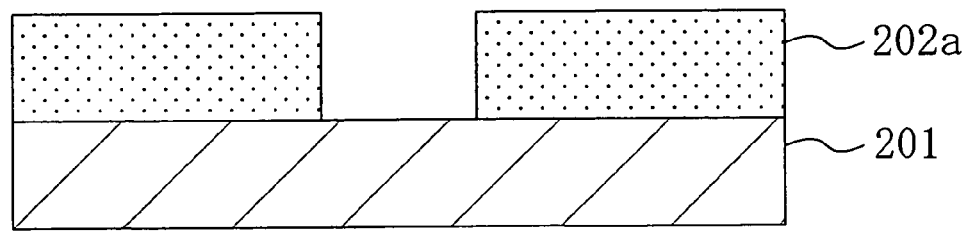

After the pattern exposure, as shown in FIG. 3C, the resist film 202 is baked with a hot plate at a temperature of 105° C. for 60 seconds. Thereafter, the resultant resist film 202 is developed with a 0.26 N tetramethylammonium hydroxide developer. In this manner, a resist pattern 202a made of an unexposed portion of the resist film 202 and having an opening width of 0.09 μm is formed as shown in FIG. 3D.

Figure 4A:
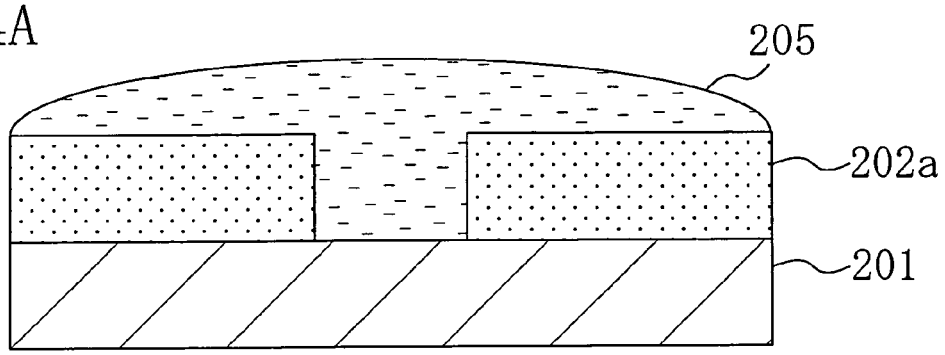
FIGS. 4A, 4B and 4C are cross-sectional views for showing other procedures in the pattern formation method of Embodiment 2
Figure 4B:
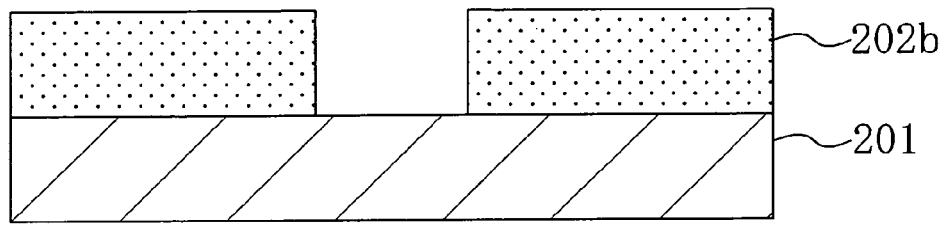

Next, as shown in FIG. 4A, an alkaline aqueous solution 205 including, for example, 0.30 N of tetramethylammonium hydroxide is dropped onto the resist pattern 202a by what is called a puddle method, thereby exposing the resist pattern 202a to the alkaline aqueous solution 205 for 10 seconds. Through this puddle process, lactone rings included in the resist pattern 202a are opened so as to give a resist pattern 202b as shown in FIG. 4B.

Figure 4C:
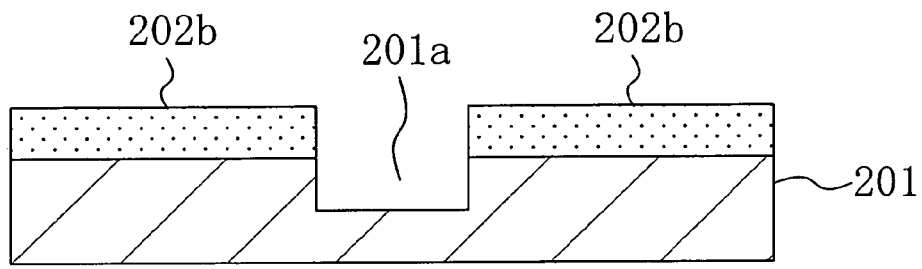

Then, as shown in FIG. 4C, with the resist pattern 202b, in which the lactone rings are opened, used as a mask, the substrate 201 is etched by using an etching gas including fluorine radicals. In this manner, a recess 201a having an opening width of 0.09 μm is formed in the substrate 201 as shown in a plan view of FIG. 4D. At this point, FIG. 4C is a cross-sectional view taken on line IVc-IVc of FIG. 4D.

Figure 4D:
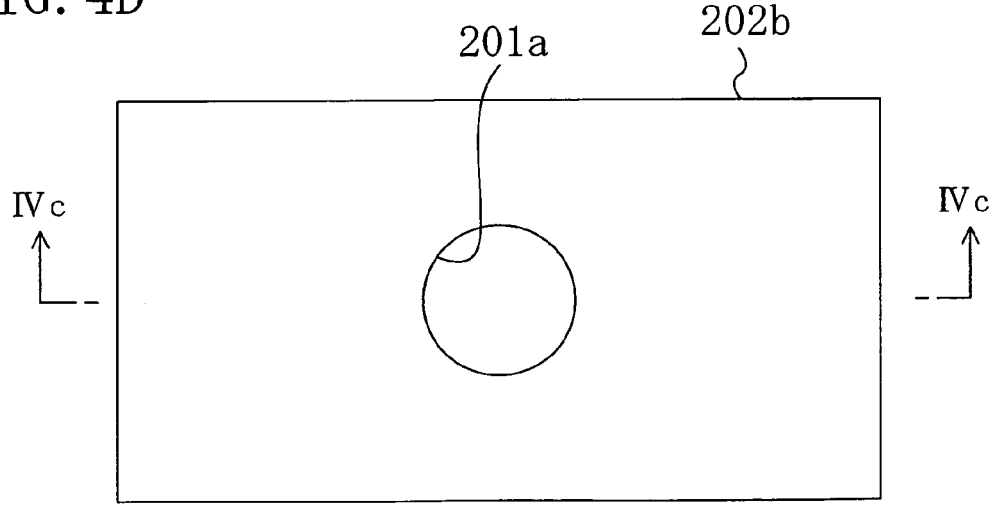
FIG. 4D is a plan view of FIG. 4C.
Figure 5A:
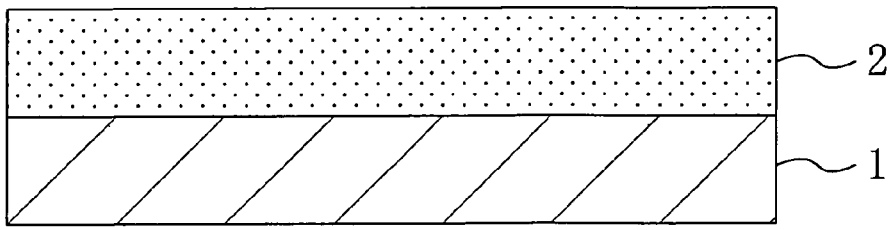
FIGS. 5A, 5B, 5C and 5D are cross-sectional views for showing procedures in a conventional pattern formation method.
Figure 5B:
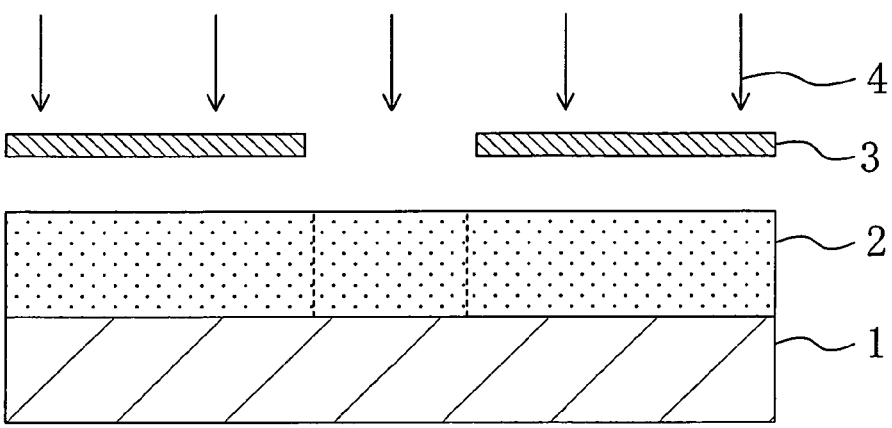
Figure 5C:
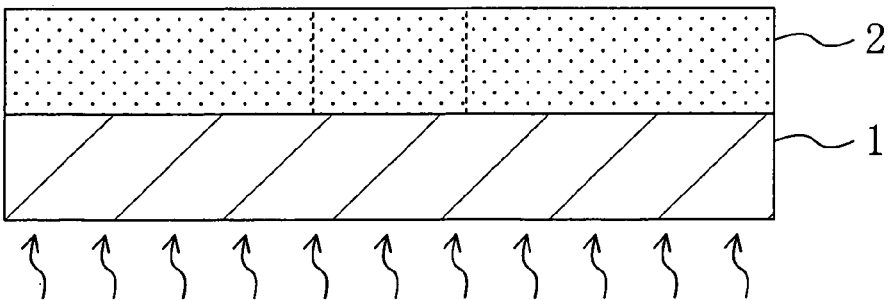
Figure 5D:
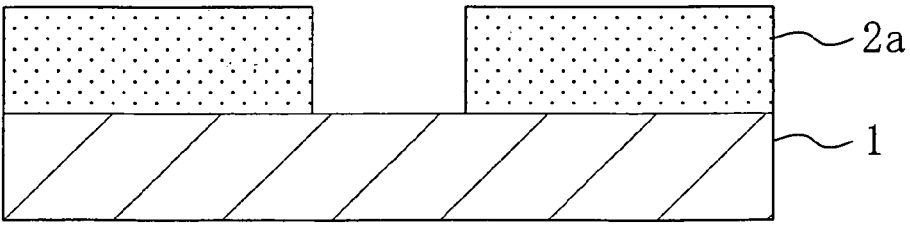
Figure 6A:
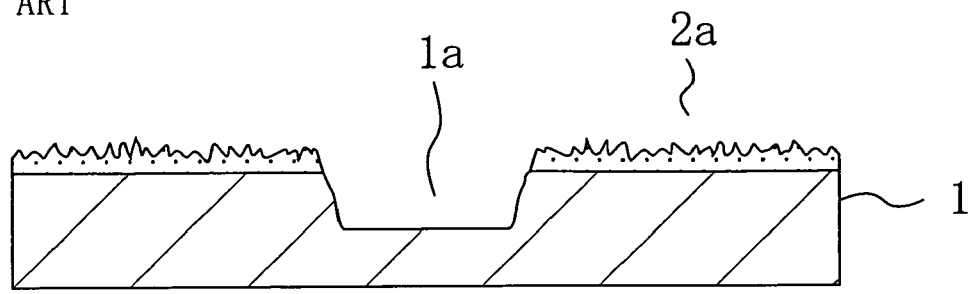
FIG. 6A is a cross-sectional view for showing another procedure in the conventional pattern formation method and FIG. 6B is a plan view of FIG. 6A.
Figure 6B:
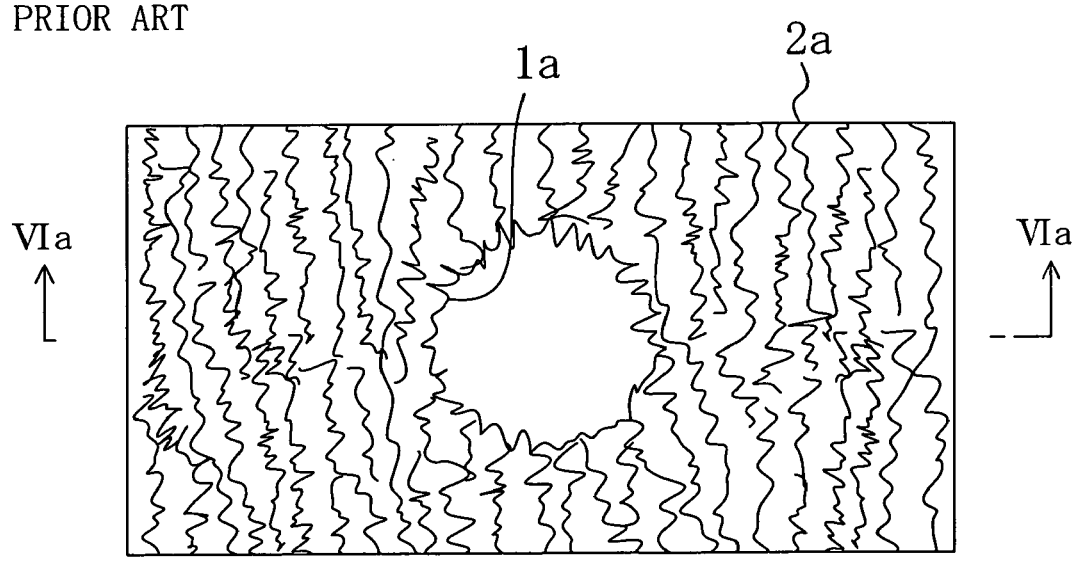

In this manner, according to Embodiment 2, since the resist pattern 202a formed through the development is exposed to the alkaline aqueous solution 205 in the step shown in FIG. 4A, the lactone rings included in the resist material are opened before performing the etching. Accordingly, the resist pattern 202b where the lactone rings have been opened is free from surface roughness otherwise caused by the radicals or the like included in the etching gas during the subsequently performed etching (as shown in FIGS. 4C and 4D). This is for the following reason: Since the lactone rings have been already opened, the radicals used in the etching are never consumed in the ring opening reaction, and therefore, a stable amount of radicals can be supplied to the surface of the substrate 201 to be etched. As a result, the recess 201a formed in the substrate 201 by the etching can be in a good shape.

It is noted that the lactone rings are minimally opened during the development because they are opened at normality approximately 1.1 times as large as the normality of a general alkaline developer, that is, 0.26 N.

The puddle method is employed for exposing the resist pattern to the acidic or alkaline aqueous solution in Embodiment 1 or 2, which does not limit the invention, and for example, a dip method in which the whole substrate is dipped in a solution may be employed instead.

Although a positive chemically amplified resist is used for a resist film in each embodiment, the invention is applicable also to a negative chemically amplified resist.

Although the ArF excimer laser is used as the exposing light in each embodiment, KrF excimer laser, $Xe_2$ laser, $F_2$ laser, KrAr laser or $Ar_2$ laser may be used instead.

As described so far, in the pattern formation method of this invention, a fine pattern can be formed in a good shape, and the present invention is useful for forming a fine pattern in fabrication process for semiconductor devices.

What is claimed is:

1. A pattern formation method comprising the steps of:
   forming a resist film including a compound having a lactone ring on a substrate;
   performing pattern exposure by selectively irradiating said resist film with exposing light;
   forming a resist pattern made of said resist film by developing said resist film after the pattern exposure;
   opening said lactone ring included in said resist pattern; and
   etching said substrate by using, as a mask, said resist pattern in which said lactone ring has been opened.

2. The pattern formation method of claim 1, wherein the step of opening said lactone ring is executed by exposing said resist pattern to an acidic aqueous solution.

3. The pattern formation method of claim 2, wherein said acidic aqueous solution includes a compound having a carboxylic acid group or a sulfonic acid group.

4. The pattern formation method of claim 3, wherein said compound having a carboxylic acid group is acrylic acid, methacrylic acid or benzoic acid.

5. The pattern formation method of claim 3, wherein said compound having a sulfonic acid group is styrene sulfonic acid.

6. The pattern formation method of claim 1, wherein the step of opening said lactone group is executed by exposing said resist pattern to an alkaline aqueous solution having larger alkali normality than a developer used in developing said resist film.

7. The pattern formation method of claim 6, wherein said alkaline aqueous solution includes an amine compound.

8. The pattern formation method of claim 7, wherein said amine compound is tetramethylammonium hydroxide, tetraethylammonium hydroxide or choline.

9. The pattern formation method of claim 1, wherein said exposing light is KrF excimer laser, $Xe_2$ laser, ArF excimer laser, $F_2$ laser, KrAr laser or $Ar_2$ laser.

* * * * *